(12) United States Patent
Ohuchi

(10) Patent No.: US 6,249,043 B1
(45) Date of Patent: Jun. 19, 2001

(54) RESIN-SEALED TYPE SEMICONDUCTOR DEVICE, AND METHOD OF MANUFACTURING THE SAME

(75) Inventor: Shinji Ohuchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/321,587

(22) Filed: May 28, 1999

(30) Foreign Application Priority Data

Jun. 2, 1998 (JP) .................................................. 10-153040

(51) Int. Cl.$^7$ ................................................ H01L 23/495
(52) U.S. Cl. ............................................ 257/668; 257/676
(58) Field of Search ................................. 257/668, 676, 257/723, 778

(56) References Cited

U.S. PATENT DOCUMENTS 5,227,664 * 7/1993 Toshio et al. ........................ 257/723
5,834,848 * 11/1998 Iwasaki ................................. 257/778
6,087,716 * 7/2000 Ikeda ..................................... 257/676

FOREIGN PATENT DOCUMENTS

| 8-64725 | 3/1996 | (JP) . |
| 8-195417 | 7/1996 | (JP) . |
| 9-82850 | 3/1997 | (JP) . |
| 9-139404 | 5/1997 | (JP) . |

* cited by examiner

Primary Examiner—Don Wong
Assistant Examiner—James Clinger
(74) Attorney, Agent, or Firm—Rabin & Champagne, P.C.

(57) ABSTRACT

A resin-sealed type semiconductor device, comprises a wiring substrate 100 having a wiring pattern 102 formed thereon, a semiconductor element 101 having bump electrodes 103 for connecting to the wiring pattern 102 formed on the surface thereof, and resin 105 for sealing between the wiring substrate 100 and the semiconductor element 101, the width of the semiconductor element 101 being greater than the width of the wiring substrate 100, and a method of manufacturing the same.

22 Claims, 5 Drawing Sheets

RESIN-SEALED TYPE SEMICONDUCTOR DEVICE, AND METHOD OF MANUFACTURING THE SAME

BACKGROUND OF THE INVENTION

1. Field of the Invention

The present invention relates to a resin-sealed type semiconductor device, for mounting in a portable communication device etc. Specifically, the present invention relates to a highly reliable resin-sealed semiconductor device that is small in size, and can suppress the occurrence of warping.

2. Description of the Related Art

Up to now, resin-sealed type semiconductor devices that have a semiconductor element with electrodes formed on a wiring substrate constituting a wiring pattern, and a resin seal between the wiring substrate and the semiconductor element, have been proposed as resin-sealed type semiconductor devices.

SUMMARY OF THE INVENTION

An object of the present invention in to provide a highly reliable resin-sealed semiconductor device that is small in size, and can suppress the occurrence of warping of a gap inside the device and the device body itself, and a method of manufacturing such a semiconductor device.

In order to achieve the above described object, a resin-sealed type semiconductor device of the present invention comprises a wiring substrate constituting a wiring pattern, a semiconductor element having electrodes for connecting to the wiring pattern formed on surfaces thereof, and a resin seal between the wiring substrate and the semiconductor element, wherein the width of the semiconductor element is greater than the width of the wiring substrate.

Further, also in order to achieve the above described object, a method of manufacturing a resin-sealed semiconductor device of the present invention comprises the steps of arranging the semiconductor element having electrodes and a width greater than the width of the wiring substrate on the wiring substrate constituting a wiring pattern so that the wiring pattern and the electrodes are connected, and forming a resin seal between the semiconductor element and the wiring substrate by supplying resin from a gap between the semiconductor element and the wiring substrate.

DETAILED DESCRIPTION OF THE PRESENT INVENTION

Figure 1:
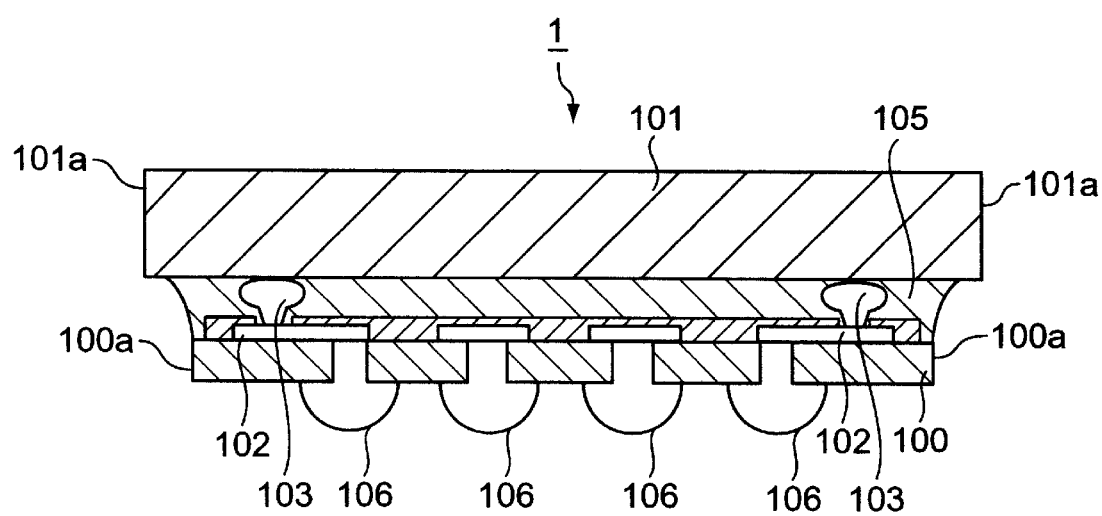
FIG. 1 is a cross sectional view of a resin sealed semiconductor device of a first embodiment of the present invention.

FIG. 1 is a cross sectional drawing of a resin-sealed semiconductor device of a first embodiment of the present invention.

The resin-sealed semiconductor device 1 of a first embodiment of the present invention has a flip chip construction, and is formed in the following manner.

A semiconductor element 101 is mounted on that surface of a wiring substrate 100 on which a wiring pattern 102 is formed. The wiring pattern 102 is formed in a specified shape using copper (Cu), and is connected to bump electrodes 103 formed on the surface of the semiconductor element 101. A gap between the semiconductor element 101 and the wiring substrate 100 is sealed using resin 105. Also, solder balls 106 for connecting the semiconductor device 1 to a wiring pattern of a printed circuit board etc., not shown in the drawing, are provided on the surface of the wiring substrate 100 on which the semiconductor element 101 is not mounted. These solder balls 106 are connected to the wiring pattern 102 formed on the wiring substrate 100 via through holes. At this point, the wiring substrate 100 is smaller than the semiconductor element 101. That is, the planar size of the wiring substrate 100 is of such a size that the shape of an outer edge 101a of the semiconductor element surrounds the shape of an outer edge 100a of the wiring substrate, looking in a direction perpendicular to the surface of the semiconductor element 101 on which the bump electrodes 103 are formed. Accordingly, the outer edge 100a of the wiring substrate 100 does not jut out from the outer edge 101a of the semiconductor element 101, which means that the overall size of the semiconductor device 1 can be made small. As a result, miniaturization of the semiconductor device 1 can be realized accompanying shrinkage of the semiconductor device 1. Also, because the wiring substrate 100 itself is made small, the surface area of a gap between the semiconductor element 101 and the wiring substrate 100 is also narrowed. As a result, the possibility of a gap occurring between the semiconductor element 101 and the wiring substrate 100 is lowered, and it is also possible to suppress warping of the semiconductor device 1 that is normally due to differences in coefficient of thermal expansion between the semiconductor element 101 and the wiring substrate 100.

Figure 2A:
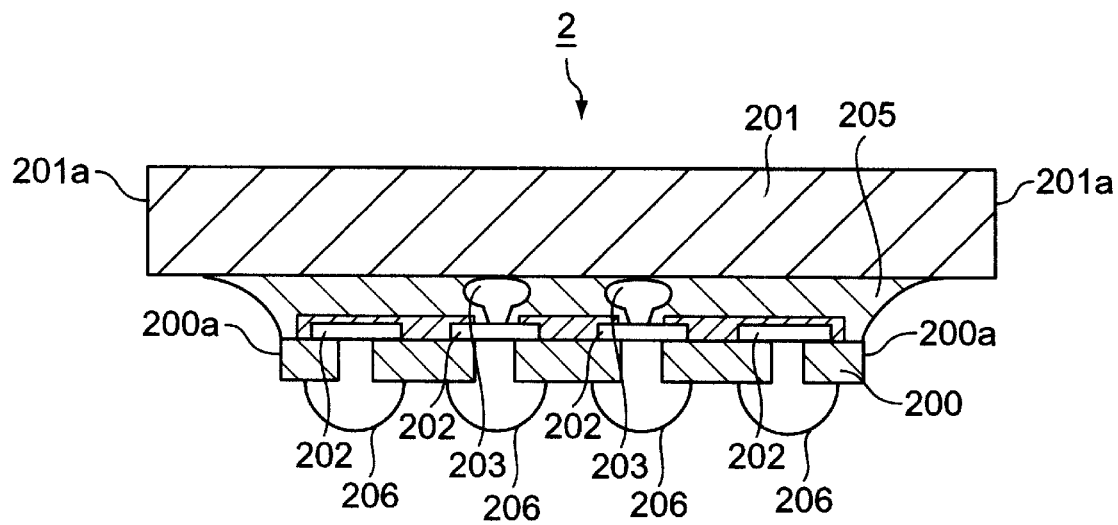
FIG. 2A is a cross sectional drawing of a resin sealed semiconductor device of a second embodiment of the present invention.

FIG. 2A is a cross sectional drawing of a resin sealed semiconductor device of a second embodiment of the present invention.

The resin-sealed semiconductor device 2 of a first embodiment of the present invention has a flip chip construction, and is formed in the following manner.

A semiconductor element 201 is mounted on that surface of a wiring substrate 200 on which a wiring pattern 202 is formed. The wiring pattern 202 is formed in a specified shape using copper (Cu), and is connected to bump electrodes 203 formed of the surface of the semiconductor element 201. A gap between the semiconductor element 201 and the wiring substrate 200 is sealed using resin 205. Also, solder balls 206 for connecting the semiconductor device 2 to a wiring pattern of a printed circuit board etc., not shown in the drawing, are provided on the surface of the wiring substrate 200 on which the semiconductor element 201 is not mounted. These solder balls 206 are connected to the wiring pattern 202 formed on the wiring substrate 200 via through holes. At this point, the wiring substrate 200 is smaller than the semiconductor element 201. That is, the planar size of the wiring substrate 200 is of such a size that the shape of an outer edge 201a of the semiconductor element surrounds the shape of an outer edge 200a of the wiring substrate, looking in a direction perpendicular to the surface of the semiconductor element 201 on which the bump electrodes 203 are formed. Also, with the second embodiment, when the semiconductor device 2 is viewed from above, those solder balls 206 that are provided on the wiring substrate are positioned further away from the center of the semiconductor device 2 than the bump electrodes 203 formed on the semiconductor element 201.

With the resin sealed semiconductor device of the second embodiment described above, the outer edge 200a of the wiring substrate 200 does not jut out from the outer edge 201a of the semiconductor element 201, which means that the overall size of the semiconductor device 2 can be made small. As a result, miniaturization of the semiconductor device 2 can be realized accompanying shrinkage of the semiconductor device 2. Also, because the wiring substrate 200 itself is made small, the surface area of a gap between the semiconductor element 201 and the wiring substrate 200 is also reduced. As a result, the possibility of a gap occurring between the semiconductor element 201 and the wiring substrate 200 is lowered, and it is also possible to suppress warping of the semiconductor device 2 due to differences in coefficient of thermal expansion between the semiconductor element 201 and the wiring substrate 200.

Figure 2B:
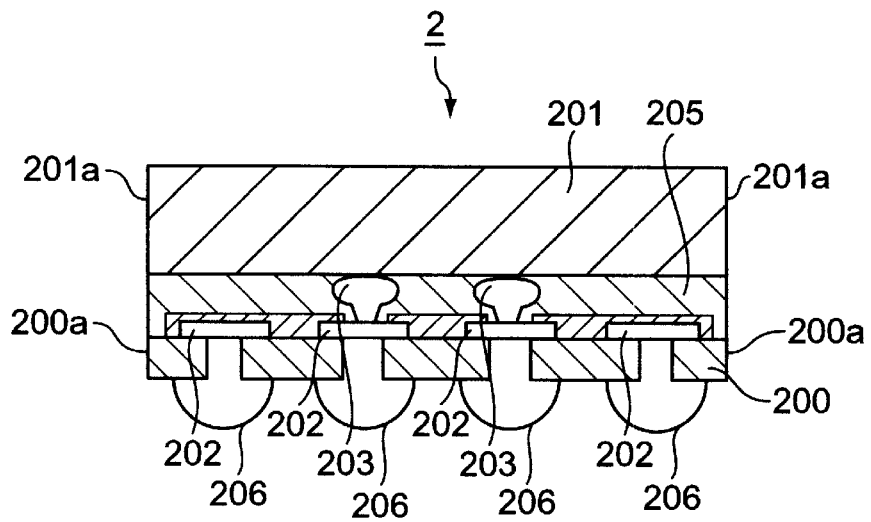
FIG. 2B is a cross sectional drawing of a resin sealed semiconductor device of the second embodiment of the present invention when the semiconductor element has been shrunk.

Further, the position of the bump electrodes 203 is further inside than the position of the solder balls 206, which means that the bump electrodes 203 no longer overhang further than outside than the outer edge 200a of the wiring substrate 200. As a result, as shown in FIG. 2B, even if the semiconductor element 201 is reduced in size to effectively the same size as the wiring substrate 200, the bump electrodes 203 formed on the surface of the semiconductor element 201 can be reliably connected to the circuit pattern 202 formed on the surface of the wiring substrate 200, and it is possible to adopt a flip chip structure that is not related to shrinkage of the semiconductor element 201.

Figure 3A:
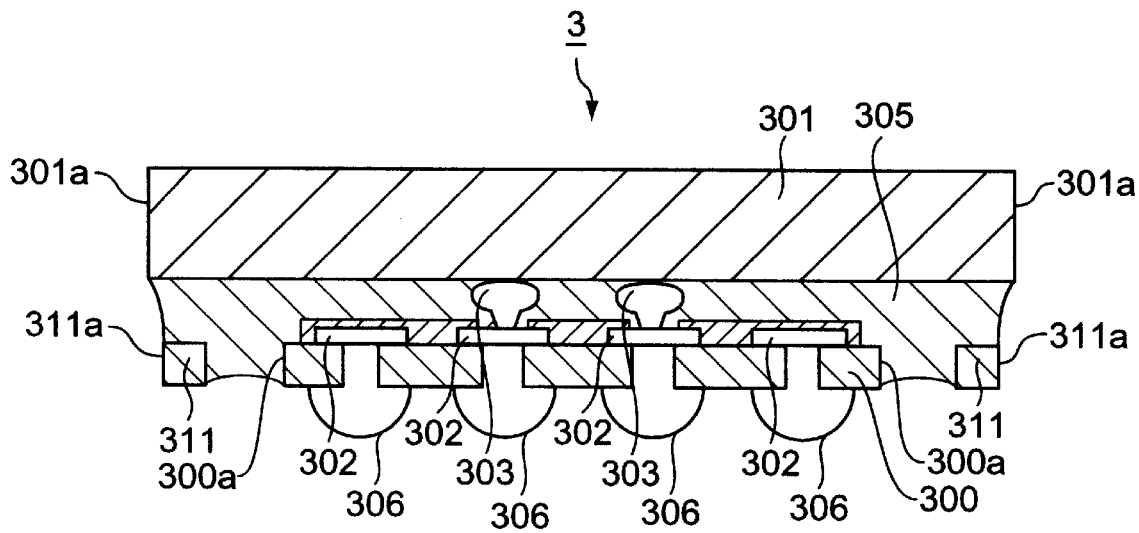
FIG. 3A is a cross sectional drawing of a resin sealed semiconductor device of a third embodiment of the present invention.

FIG. 3A is a cross sectional drawing of a resin sealed semiconductor device of a third embodiment of the present invention.

The resin-sealed semiconductor device 3 of the third embodiment of the present invention has a flip chip construction, and is formed in the following manner.

Figure 3B:
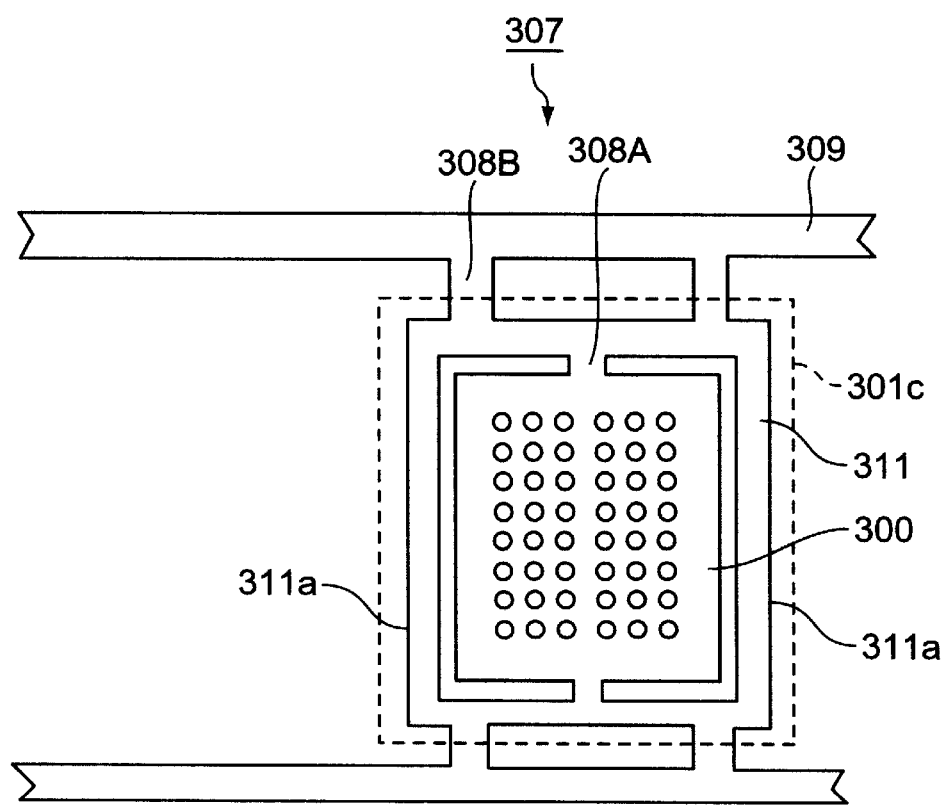
FIG. 3B is a plan view of a tape carrier of the third embodiment of the present invention.

A semiconductor element 301 is mounted on that surface of a wiring substrate 300 on which a wiring pattern 302 is formed. The wiring pattern 302 is formed in a specified shape using copper (Cu), and is connected to bump electrodes 303 formed on the surface of the semiconductor element 301. A gap between the semiconductor element 301 and the wiring substrate 300 is sealed using resin 305. Also, solder balls 306 for connecting the semiconductor device 3 to a wiring pattern of a printed circuit board etc., not shown in the drawing, are provided on the surface of the wiring substrate 300 on which the semiconductor element 301 is not mounted. These solder balls 306 are connected to the wiring pattern 302 formed on the wiring substrate 300 via through holes. At this point, the wiring substrate 300 is smaller than the semiconductor element 301. That is, the planar size of the wiring substrate 300 is of such a size that the shape of an outer edge 301a of the semiconductor element surrounds the shape of an outer edge 300a of the wiring substrate, looking in a direction perpendicular to the surface of the semiconductor element 301 on which the bump electrodes 303 are formed. Also, with the second embodiment, when the semiconductor device 3 is viewed from above, those solder balls 306 that are provided on the wiring substrate are positioned further away from the center of the semiconductor device 3 than the bump electrodes 303 formed on the semiconductor element 301. As shown in FIG. 3B, in a tape carrier 307 the wiring substrate 300 of the third embodiment is isolated from a frame 309 by a supporter 308B. A substrate frame 311 supported by the supporter 308A is provided around the periphery of the wiring substrate 300 open at fixed intervals along the outer edge of the wiring substrate 300. The size of the substrate frame 311 is smaller than the semiconductor element 301, and is formed so that the outer edge 311a of the substrate frame 311 is not forced further outward than the outer edge 301 a of the semiconductor element 301. Parts enclosed by the dotted line 301c in FIG. 3B represent locations of the outer edge 301a of the semiconductor element 301 mounted on the tape carrier 307.

With the resin-sealed type semiconductor device of the third embodiment as described above, the outer edge 300a of the wiring substrate 300 does not jut out from the outer edge 301 a of the semiconductor element 301, which means that the overall size of the semiconductor device 3 can be made small. As a result, miniaturization of the semiconductor device 3 can be realized accompanying shrinkage of the semiconductor device 3. Also, because the wiring substrate 300 itself is made small, the surface area of a gap between the semiconductor element 301 and the wiring substrate 300 is also reduced. As a result, the possibility of a gap occurring between the semiconductor element 301 and the wiring substrate 300 is lowered, and it is also possible to suppress warping of the semiconductor device 3 that is normally due to differences in coefficient of thermal expansion between the semiconductor element 301 and the wiring substrate 300.

Further, with the resin-sealed type semiconductor device of the third embodiment, the position of the bump electrodes 303 is further inside than the position of the solder balls 306, which means that the bump electrodes 303 no longer overhang further than outside than the outer edge 300a of the wiring substrate 300. As a result, even if the semiconductor element 301 is reduced in size to effectively the same size as the wiring substrate 300, the bump electrodes 303 formed on the surface of the semiconductor element 301 can be reliably connected to the circuit pattern 303 formed on the surface of the wiring substrate 300, and it is possible to adopt a flip chip structure that is not related to shrinking of the semiconductor element 301. Also, the substrate frame 307 and the wiring substrate 300 are formed separately, even if the semiconductor element becomes small, which means that the size of the substrate frame 307 is preferably made small, and there is no need to alter the size of the wiring substrate 300.

Figure 4A:
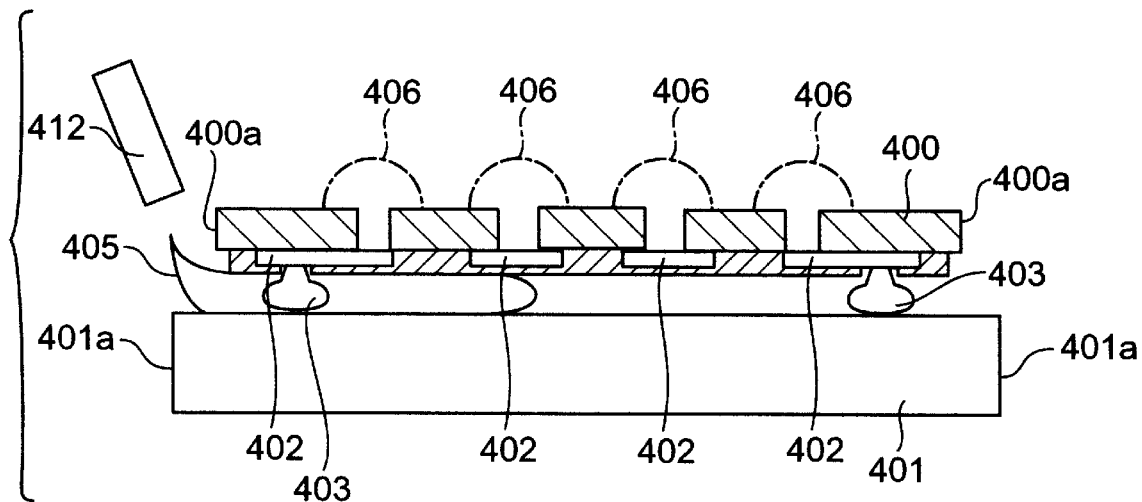
FIG. 4A is a cross sectional drawing of a method of manufacturing a resin sealed semiconductor device of a fourth embodiment of the present invention.

FIG. 4A is a cross sectional drawing of a method of manufacturing a resin sealed semiconductor device of a fourth embodiment of the present invention.

First of all, a semiconductor element 401 is prepared, so as to be in such a state that a surface on which bump electrodes 403 are formed is facing upwards, and a wiring substrate 400 having a planar size larger than the semiconductor element 401 is placed on the semiconductor substrate 401. At this time, the surface of the wiring substrate on which a wiring pattern 402 is formed faces downwards, and the wiring pattern 402 is connected to the bump electrodes 403 of the semiconductor substrate 401. Also, the wiring substrate 400 is placed on the semiconductor element 401 so that the outer edge 401a of the semiconductor substrate 401 juts further outwards than the outer edge 400a of the wiring substrate 400.

Next, using a nozzle 407, molten resin 405 is supplied from the vicinity of a surface of the semiconductor element 402 jutting further out than the outer edge of 400a of the wiring substrate 400 arranged on the semiconductor substrate 401 into a gap between the semiconductor element 401 and the wiring substrate 400. In this case, the molten resin 405 flows smoothly into the gap between the semiconductor element 401 and the wiring substrate 400 due to a capillary phenomenon. After the resin 405 has hardened, by heating for example to about 300° C., the bump electrodes 402 of the semiconductor element 401 and the wiring pattern 402 of the wiring substrate 400 are electrically connected. Following that, solder balls 406 are formed on that surface of the wiring substrate 401 that does not have the wiring pattern formed thereon, as external electrodes. Here, the locations at which the solder balls 406 are formed are preferably further away from the center of the semiconductor element 401 than the locations at which the bump electrodes 403 are formed.

Figure 4B:
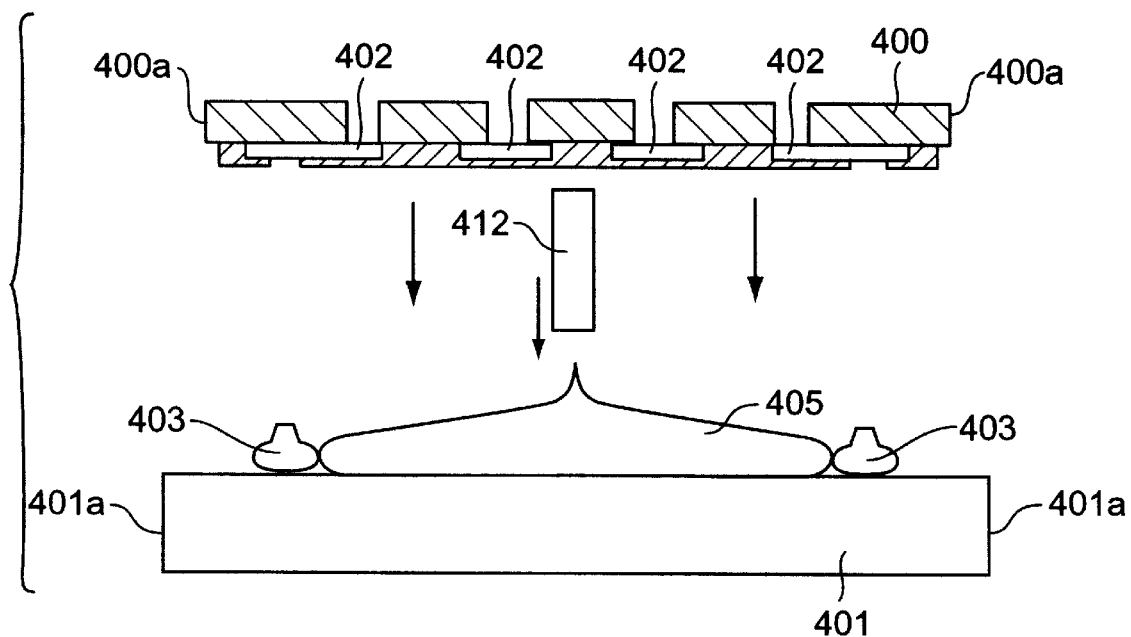
FIG. 4B is a drawing showing a method of supplying resin in the fourth embodiment of the present invention.

Further, in the fourth embodiment, description has been given for the case where resin 405 is supplied from the vicinity of a surface of the semiconductor element 402 jutting further out than the outer edge of 400a of the wiring substrate 400 arranged on the semiconductor substrate 401 into a gap between the semiconductor element 401 and the wiring substrate 400 after the wiring substrate 400 has been placed on the semiconductor element 401. However, as shown in FIG. 4B, it is also possible to supply resin before the wiring substrate 400 is placed on the semiconductor element 401, so as to expose the bump electrodes 403 on the semiconductor element 401. Manufacturing steps other than the step of placing the wiring substrate on the semiconductor element are the same as in the method described above.

Figure 5:
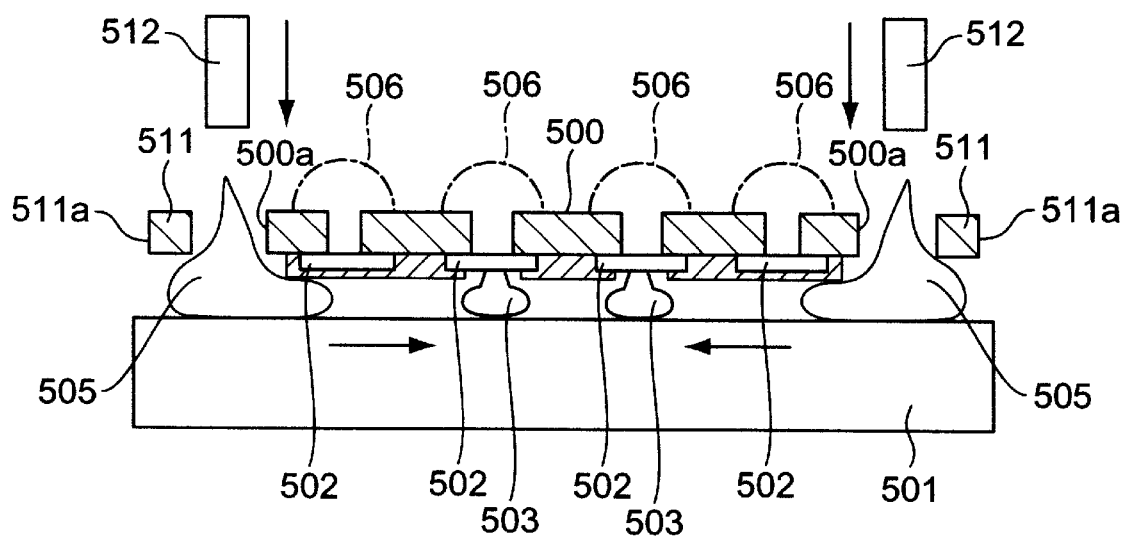
FIG. 5 is a cross sectional drawing of a method of manufacturing a resin sealed semiconductor device of a fifth embodiment of the present invention.

As has been described above, with the method of manufacturing a resin sealed semiconductor device of the fourth embodiment, the planar size of the wiring substrate 400 is smaller than that of the semiconductor element 401 which means that the surface area of a gap between the semiconductor element 401 and the wiring substrate 400 is also made smaller. Accordingly, the resin 405 can be supplied smoothly between the semiconductor element 401 and the wiring substrate 400 while reliably suppressing the occurrence of gaps FIG. 5 is a cross sectional view of a method of manufacturing a resin sealed semiconductor device of a fifth embodiment of the present invention.

First of all, a semiconductor element 501 is prepared, so as to be in such a state that a surface on which bump electrodes 503 are formed is facing upwards, and a wiring substrate 500 having a planar size larger than the semiconductor element 501 is placed on the semiconductor substrate 501. At this time, the surface of the wiring substrate on which a wiring pattern 502 is formed faces downwards, and the wiring pattern 502 is connected to the bump electrodes 503 of the semiconductor substrate 501. Also, the wiring substrate 500 is placed on the semiconductor element 501 so that the outer edge 501a of the semiconductor substrate 501 juts further outwards than the outer edge 500a of the wiring substrate 500. On the other hand, as shown in FIG. 3B, it is also possible to mount the semiconductor element 501 on the wiring substrate 300 in a condition of the tape carrier 307.

Next, using a nozzle 512, resin 505 is supplied from between the outer edge 500a of the wiring substrate 500 and the substrate frame 503 into a gap between the semiconductor element 501 and the wiring substrate 500. In this case, the molten resin 505 flows smoothly into the gap between the semiconductor element 501 and the wiring substrate 500, and into a gap between the wiring substrate 500 and the substrate frame 511, due to a capillary phenomenon. After the resin 505 has hardened, by heating for example to about 300° C., the bump electrodes 502 of the semiconductor element 501 and the wiring pattern 502 of the wiring substrate 500 are electrically connected. Following that, solder balls 506 are formed on that surface of the wiring substrate 501 that does not have the wiring pattern formed thereon, as external electrodes. Here, the locations at which the solder balls 506 are formed are preferably further away from the center of the semiconductor element 501 than the locations at which the bump electrodes 503 are formed.

As has been described above, with the method of manufacturing a resin sealed semiconductor device of the fifth embodiment, the planar size of the wiring substrate 500 is smaller than that of the semiconductor element 501 which means that the surface area of a gap between the semiconductor element 501 and the wiring substrate 500 is also made narrower. Accordingly, the resin 505 can be supplied smoothly between the semiconductor element 501 and the wiring substrate 500 while reliably suppressing the occurrence of gaps. Also, by using a plurality of the nozzles 512 resin 505 can be supplied quickly between the semiconductor element 501 and the wiring substrate 500.

What is claimed is:

1. A resin-sealed semiconductor device, comprising:
   a wiring substrate having a first surface and a second surface opposite to the first surface, the wiring substrate having a wiring pattern formed on the first surface thereof;
   a semiconductor element having a plurality of electrodes connected to the wiring pattern, formed on a surface thereof; and
   a resin for sealing between the wiring substrate and the semiconductor element, wherein the width of the semiconductor element is greater than the width of the wiring substrate.

2. The resin-sealed semiconductor device as claimed in claim 1, further comprising a plurality of external electrodes formed on the second surface of the wiring substrate.

3. The resin-sealed semiconductor device as claimed in claim 2, wherein the external electrodes are spherical solder balls.

4. The resin-sealed semiconductor device as claimed in claim 2, wherein the external electrodes are arranged on the wiring substrate outside of the electrodes formed on the semiconductor element.

5. The resin-sealed semiconductor device as claimed in claim 1, further comprising a substrate frame arranged along an outer edge of the wiring substrate; and wherein an outer edge of the semiconductor element is either aligned with an outer edge of the substrate frame or surrounds the outer edge of the substrate frame, when viewed from a direction perpendicular to a plane of the semiconductor element.

6. The resin-sealed semiconductor device as claimed in claim 1, further comprising a substrate frame arranged along an outer edge of the wiring substrate;
   and wherein an outer edge of the substrate frame is located inside of an outer edge of the semiconductor element.

7. A resin-sealed semiconductor devce, comprising:
   a wiring substrate having a first surface and a second surface opposite to the first surface, the wiring substrate having a wiring pattern formed on the first surface thereof;

a substrate frame;

a semiconductor element having a plurality of electrodes connected to the wiring pattern, formed on a surface thereof; and a resin for sealing between the wiring substrate and the semiconductor element, wherein an outer edge of the semiconductor element is either aligned with an outer edge of the substrate frame or surrounds the outer edge of the substrate frame, when viewed from a direction perpendicular to a plane of the semiconductor element.

8. The resin-sealed semiconductor device as claimed in claim 7, further comprising a plurality of external electrodes formed on the second surface of the wiring substrate.

9. The resin-sealed semiconductor device as claimed in claim 8, wherein the external electrodes are spherical solder balls.

10. The resin-sealed semiconductor device as claimed in claim 8, wherein the external electrodes are arranged on the wiring substrate outside of the electrodes formed on the semiconductor element.

11. A resin-sealed semiconductor device, comprising:

a wiring substrate having a first surface and a second surface opposite to the first surface, the wiring substrate having a wiring pattern formed on the first surface thereof;

a semiconductor element having a plurality of electrodes connected to the wiring pattern, formed on a surface thereof; and a resin seal between the wiring substrate and the semiconductor element, wherein an outer edge of the semiconductor element is located outside of an outer edge of the wiring substrate.

12. The resin-sealed semiconductor device as claimed in claim 11, further comprising a plurality of external electrodes formed on the second surface of the wiring substrate.

13. The resin-sealed semiconductor device as claimed in claim 12, wherein the external electrodes are spherical solder balls.

14. The resin-sealed semiconductor device as claimed in claim 12, wherein the external electrodes are arranged on the wiring substrate outside of the electrodes formed on the semiconductor element.

15. The resin-sealed semiconductor device as claimed in claim 11, further comprising a substrate frame arranged along an outer edge of the wiring substrate; and wherein an outer edge of the semiconductor element is either aligned with an outer edge of the substrate frame or surrounds the outer edge of the substrate frame, when viewed from a direction perpendicular to a plane of the semiconductor element.

16. The resin-sealed semiconductor device as claimed in claim 11, further comprising a substrate frame arranged along an outer edge of the wiring substrate; and wherein an outer edge of the substrate frame is located inside of an outer edge of the semiconductor element.

17. A resin-sealed semiconductor device, comprising:

a wiring substrate having a first surface and a second surface opposite to the first surface, the wiring substrate having a wiring pattern formed on the first surface thereof;

a semiconductor element having a plurality of electrodes connected to the wiring pattern, formed on a surface thereof; and a resin seal between the wiring substrate and the semiconductor element, wherein an outer edge of the wiring substrate juts further out than the outer edge of the wiring substrate.

18. The resin-sealed semiconductor device as claimed in claim 17, further comprising a plurality of external electrodes formed on the second surface of the wiring substrate.

19. The resin-sealed semiconductor device as claimed in claim 18, wherein the external electrodes are spherical solder balls.

20. The resin-sealed semiconductor device as claimed in claim 18, wherein the external electrodes are arranged on the wiring substrate outside of the electrodes formed on the semiconductor element.

21. The resin-sealed semiconductor device as claimed in claim 17, further comprising a substrate frame arranged along an outer edge of the wiring substrate; and wherein an outer edge of the semiconductor element is either aligned with an outer edge of the substrate frame or surrounds the outer edge of the substrate frame, when viewed from a direction perpendicular to a plane of the semiconductor element.

22. The resin-sealed semiconductor device as claimed in claim 17, further comprising a substrate frame arranged along an outer edge of the wiring substrate; and wherein an outer edge of the substrate frame is located inside of an outer edge of the semiconductor element.

* * * * *